US010782916B2

(12) United States Patent
Meyerowitz et al.

(10) Patent No.: US 10,782,916 B2
(45) Date of Patent: Sep. 22, 2020

(54) PROACTIVE RETURN OF WRITE CREDITS IN A MEMORY SYSTEM (71) Applicant: Micron Technology, Inc., Boise, ID (US)

(72) Inventors: Trevor Conrad Meyerowitz, Morgan Hill, CA (US); Dhawal Bavishi, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/058,733

(22) Filed: Aug. 8, 2018

(65) Prior Publication Data
US 2020/0050398 A1    Feb. 13, 2020

(51) Int. Cl.
G06F 3/06       (2006.01)
G11C 5/04      (2006.01)

(52) U.S. Cl.
CPC .......... G06F 3/0659 (2013.01); G06F 3/0617 (2013.01); G06F 3/0619 (2013.01); G06F 3/0656 (2013.01); G06F 3/0685 (2013.01); G06F 3/0688 (2013.01); G11C 5/04 (2013.01)

(58) Field of Classification Search
CPC ....... G11C 5/04; G06F 3/0659; G06F 3/0617; G06F 3/0613; G06F 3/0688; G06F 3/0685; G06F 3/0656; G06F 3/0619
USPC .......................................................... 711/101
See application file for complete search history.

(56) References Cited

U.S. PATENT DOCUMENTS

| 5,561,823 A | 10/1996 | Anderson |
| 7,953,950 B2 | 5/2011 | Fujimoto |
| 8,539,140 B2 | 9/2013 | Fujimoto |
| 8,667,254 B1 | 3/2014 | Rohrer et al. |
| 10,204,041 B2 * | 2/2019 | Allen .................. G06F 12/0246 |
| 2007/0183198 A1 | 8/2007 | Otsuka et al. |
| 2008/0120443 A1 | 5/2008 | Rajan et al. |
| 2009/0172286 A1 * | 7/2009 | Lasser ................. G06F 12/0866 711/127 |
| 2009/0175084 A1 | 7/2009 | Norman |

(Continued)

FOREIGN PATENT DOCUMENTS

JP    2017016285    1/2017

OTHER PUBLICATIONS

"Proposed DDR5 NVDIMM-P Bus Protocol", Solid State Technology Association, Committee JC-45.6, Committee Item Number 2261.13D, Aug. 2011.

(Continued)

Primary Examiner — Pierre Miche Bataille
(74) Attorney, Agent, or Firm — Greenberg Traurig (57) ABSTRACT A memory system having memory components and a processing device to receive, from a host system, write commands to store data in the memory components, store the write commands in a buffer, and execute at least a portion of the write commands. For example, this write buffer capacity can be represented by write credit values on the host and the subsystem. The processing device determines an amount of available capacity of the buffer that becomes available after execution of at least the portion of the write commands, and signals the host system to receive information identifying the amount of available capacity, without a pending information request received from the host system.

17 Claims, 5 Drawing Sheets (56) References Cited

U.S. PATENT DOCUMENTS

| | | | |
|---|---|---|---|
| 2012/0265945 A1* | 10/2012 | Miyasaka | G07G 1/0009 |
| | | | 711/153 |
| 2013/0013853 A1* | 1/2013 | Yeh | G06F 12/0246 |
| | | | 711/103 |
| 2014/0195701 A1 | 7/2014 | Chen et al. | |
| 2015/0288977 A1* | 10/2015 | Chan | H04N 19/426 |
| | | | 348/487 |
| 2017/0123721 A1* | 5/2017 | Sela | G06F 3/0611 |
| 2017/0171553 A1 | 6/2017 | Kim et al. | |
| 2018/0060232 A1* | 3/2018 | Oshinsky | G06F 12/0804 |
| 2018/0188998 A1 | 7/2018 | Shaharabany et al. | |
| 2019/0196716 A1 | 6/2019 | Xiao et al. | |
| 2020/0050366 A1 | 2/2020 | Bavishi et al. | |

OTHER PUBLICATIONS

International Search Report and Written Opinion, PCT/US2019/043300, dated Nov. 11, 2019.
International Search Report and Written Opinion, PCT/US2019/043318, dated Nov. 7, 2019.

\* cited by examiner

PROACTIVE RETURN OF WRITE CREDITS IN A MEMORY SYSTEM

FIELD OF THE TECHNOLOGY

Embodiments of the disclosure relate generally to memory systems, and more specifically, relate to proactive returning write credits in a memory system.

BACKGROUND

A memory sub-system can be a storage system, such as a solid-state drive (SSD) or, a memory module, such as a non-volatile dual in-line memory module (NVDIMM), and can include one or more memory components that store data. The memory components can be, for example, non-volatile memory components and volatile memory components. In general, a host system can utilize a memory sub-system to store data at the memory components and to retrieve data from the memory components.

A standardized communication protocol allows the host system to communicate with the memory sub-system to store data and retrieve data.

For example, JEDEC (Joint Electron Device Engineering Council) Solid State Technology Association has proposed a "DDR5 NVDIMM-P Bus Protocol" for communications between a host system and an NVDIMM-P memory module. This protocol is described in detail by the JEDEC Committee Letter Ballot, Committee: JC-45.6, Committee Item Number 2261.13D, Subject: "Proposed DDR5 NVDIMM-P Bus Protocol", which is hereby incorporated by reference herein in its entirety.

BRIEF DESCRIPTION OF THE DRAWINGS

The present disclosure will be understood more fully from the detailed description given below and from the accompanying drawings of various embodiments of the disclosure.

DETAILED DESCRIPTION

At least some aspects of the present disclosure are directed to the proactive transmission of information about available buffer capacity in a memory sub-system usable to buffer write commands transmitted from a host system without the host system requesting for the information. A memory sub-system is also hereinafter referred to as a "memory device". An example of a memory sub-system is a memory module that is connected to a central processing unit (CPU) via a memory bus, such as a dual in-line memory module (DIMM), a small outline DIMM (SO-DIMM), a non-volatile dual in-line memory module (NVDIMM), etc. Another example of a memory sub-system is a storage system, such as a solid-state drive (SSD). In some embodiments, the memory sub-system is a hybrid memory/storage sub-system that provides both memory functions and storage functions. In general, a host system can utilize a memory sub-system that includes one or more memory components. The host system can provide data to be stored at the memory sub-system and can request data to be retrieved from the memory sub-system.

In some computer systems, such as a host system and a memory sub-system that are connected using an NVDIMM-P bus, write commands to store data in the memory sub-system can be buffered in the memory sub-system for execution in a time period that is not predetermined. The host system can issue commands to request information from the memory sub-system, including the information indicative of the available capacity of the memory sub-system for accepting new write commands and their data. In some instances, the memory sub-system can determine that the host system needs the information about available write buffer capacity. However, requiring the host system to issue a command to request the memory sub-system to prepare such information for transmission can consume communication resources that could be used for other commands.

At least some aspects of the present disclosure address the above and other deficiencies by the memory sub-system proactively signaling to the host system that the memory sub-system has information, ready for transmission, about available write buffer capacity. The host system can retrieve such information without a need to issue commands requesting the information and/or commands requesting the memory sub-system to prepare information and make the information ready for transmission to the host system.

Figure 1:
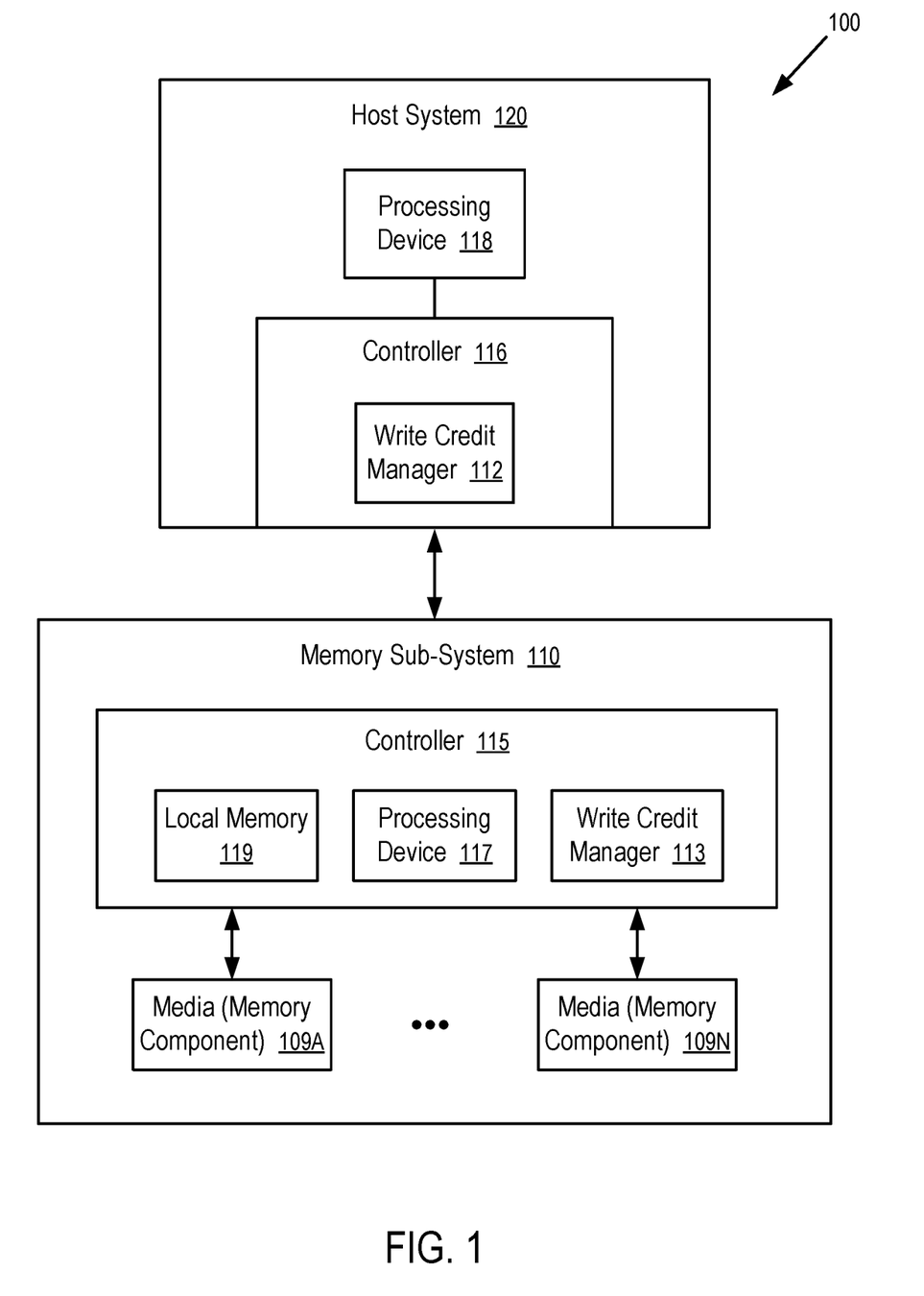
FIG. 1 illustrates an example computing system having a memory sub-system in accordance with some embodiments of the present disclosure.

FIG. 1 illustrates an example computing system 100 having a memory sub-system 110 in accordance with some embodiments of the present disclosure. The memory sub-system 110 can include media, such as memory components 109A to 109N. The memory components 109A to 109N can be volatile memory components, non-volatile memory components, or a combination of such. In some embodiments, the memory sub-system 110 is a memory module. Examples of a memory module includes a DIMM, NVDIMM, and NVDIMM-P. In some embodiments, the memory sub-system is a storage system. An example of a storage system is an SSD. In some embodiments, the memory sub-system 110 is a hybrid memory/storage sub-system. In general, the computing environment can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, etc. The physical host interface can be used to transmit data between the host system 120 and the memory sub-system 110. The host system 120 can further utilize an NVM Express (NVMe) interface to access the memory components 109A to 109N when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The host system 120 includes a processing device 118 and a controller 116. The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110.

In general, the controller 116 can send commands or requests to the memory sub-system 110 for desired access to memory components 109A to 109N. The controller 116 can further include interface circuitry to communicate with the memory sub-system 110. The interface circuitry can convert responses received from memory sub-system 110 into information for the host system 120.

The controller 116 of the host system 120 can communicate with controller 115 of the memory sub-system 110 to perform operations such as reading data, writing data, or erasing data at the memory components 109A to 109N and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory components 109A to 109N can include any combination of the different types of non-volatile memory components and/or volatile memory components. An example of non-volatile memory components includes a negative-and (NAND) type flash memory. Each of the memory components 109A to 109N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 109A to 109N can be based on any other type of memory such as a volatile memory. In some embodiments, the memory components 109A to 109N can be, but are not limited to, random access memory (RAM), read-only memory (ROM), dynamic random access memory (DRAM), synchronous dynamic random access memory (SDRAM), phase change memory (PCM), magneto random access memory (MRAM), Spin Transfer Torque (STT)-MRAM, ferroelectric random-access memory (FeTRAM), ferroelectric RAM (FeRAM), conductive bridging RAM (CBRAM), resistive random access memory (RRAM), oxide based RRAM (OxRAM), negative-or (NOR) flash memory, electrically erasable programmable read-only memory (EEPROM), nanowire-based non-volatile memory, memory that incorporates memristor technology, and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 109A to 109N can be grouped as memory pages or data blocks that can refer to a unit of the memory component used to store data.

The controller 115 of the memory sub-system 110 can communicate with the memory components 109A to 109N to perform operations such as reading data, writing data, or erasing data at the memory components 109A to 109N and other such operations (e.g., in response to commands scheduled on a command bus by controller 116). The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or another suitable processor. The controller 115 can include a processing device 117 (processor) configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 109A to 109N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 109A to 109N. The controller 115 can further include host interface circuitry to communicate with the host system 120 via the physical host interface. The host interface circuitry can convert the commands received from the host system into command instructions to access the memory components 109A to 109N as well as convert responses associated with the memory components 109A to 109N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 109A to 109N.

The computing system 100 includes a write credit manager 112 in the host system 120 and a write credit manager 113 in the memory sub-system 110 that are configured to perform proactive write credit transmission. In some embodiments, the controller 115 in the memory sub-system 110 includes at least a portion of the write credit manager 113; and the controller 116 in the host system 120 includes at least a portion of the write credit manager 112. For example, the controllers 115 and 116 can include logic circuitry implementing the write credit managers 113 and 112 respectively. For example, the controller 115 can include a processing device 117 (processor) configured to execute instructions stored in local memory 119 for performing the operations of the write credit manager 113 described herein. For example, the processing device 118 of the host system can execute instructions for performing the operations of the write credit manager 112 described herein. In some embodiments, the write credit manager 112 and/or 113 is part of an operating system of the host system 120, a device driver, or an application.

The write credit manager 113 of the memory sub-system 110 tracks the available capacity of a write buffer of the memory sub-system 110 for accepting new write commands from the host system 120. When the write credit manager 113 determines that the host system 120 is likely to request information about the available capacity, the write credit manager 113 can cause the controller 115 to proactively signal the controller 116 of the host system 120 to retrieve the information about the available capacity and thus avoid the need for the controller 116 of the host system 120 to issue a command to request for such information. Skipping the command to request for such information allows the communication resources to be used for the transmission of other commands. The write credit manager 112 of the host system 120 is configured to process such proactive requests to obtain the information about the available capacity. Further details with regards to the operations of the write credit managers 112 and 113 are described below.

Figure 2:
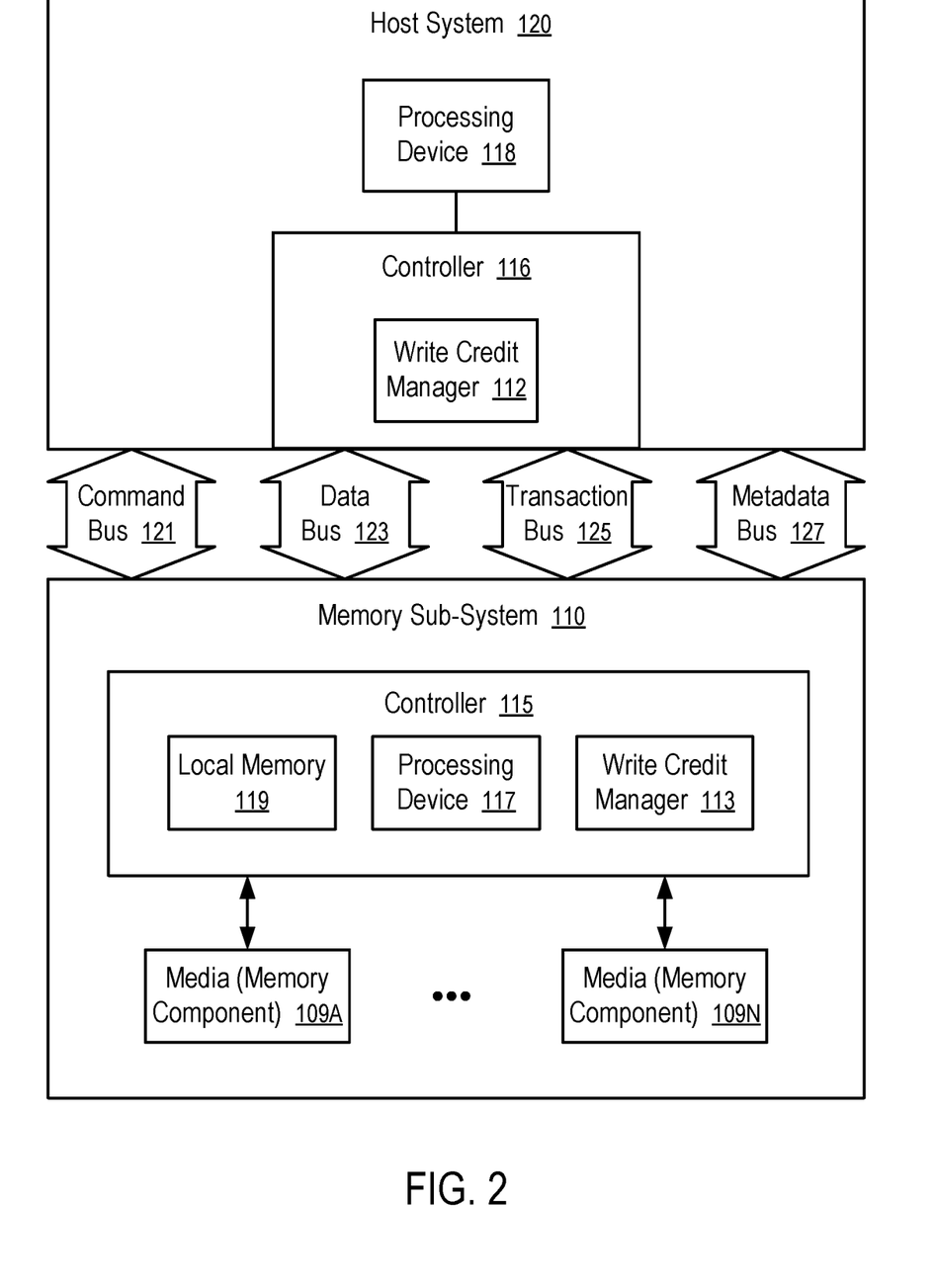
FIG. 2 illustrates an example computing system that includes write credit managers in accordance with some embodiments of the present disclosure.

FIG. 2 illustrates an example computing system that includes write credit managers 112 and 113 in accordance with some embodiments of the present disclosure.

Merely for non-limiting purposes of illustration in describing FIG. 2, the controller 116 of the host system 120 is sometimes referred to below as memory controller 116, and the controller 115 of the memory sub-system 110 is sometimes referred to below as media controller 115.

In FIG. 2, the communication channel between the host system 120 and the memory sub-system 110 includes the command bus 121, a data bus 123, a transaction bus 125, and a metadata bus 127. A communication protocol for the communication channel allows asynchronous access to the memory sub-system 110 for data storage and retrieval by the host system 120. For example, the memory sub-system 110 can be an NVDIMM; and the host system 120 can access the memory controller 116 in accordance with a JEDEC NVDIMM-P Bus Protocol using the command bus 121, the data bus 123, the transaction bus 125, and the metadata bus 127.

For example, the memory controller 116 can issue a write command to store data in the memory sub-system 110. After a fixed and predetermined time window from the transmission of the write command on the command bus 121, the memory controller 116 starts transmitting the data on the data bus 123. The memory sub-system 110 is not required to complete the operations of the write command within a predetermined time period. Examples of such a write command include XWRITE and PWRITE identified in the JEDEC NVDIMM-P Bus Protocol.

For example, the memory controller 116 can issue a read command to request information from the memory sub-system 110. The memory sub-system 110 is not required to generate a response within a predetermined time window from the read command. Examples of such a read command include XREAD and SREAD identified in the JEDEC NVDIMM-P Bus Protocol. An XREAD can be given a predetermined read ID to indicate that it is an information request (status_read) that will return system state, but won't access the media directly.

In response to the read command, the memory sub-system 110 prepares data that is requested by the read command. For example, the media controller 115 can retrieve data from media (e.g., 109A, . . . , or 109N) and buffer the retrieve data in the local memory 119 or another memory such that the data can be successfully transmitted to the memory controller 116 within a predetermined time window when such a transmission is requested.

When the requested data is ready for transmission, the memory sub-system 110 can provide a response signal in the transaction bus 125. When the memory controller 116 is informed of the readiness of the memory sub-system 110 to transmit certain data, the memory controller 116 can provide a send command to request the memory sub-system 110 to start transmitting data on the data bus 123 within a predetermined time window from the send command. When responding to the send command, the memory sub-system 115 can also send transaction status information, such as read ID identifying the corresponding read command, write credit information as further discussed below, metadata corresponding to the transaction, and/or error correction code (ECC). An example of such a send command is SEND identified in the JEDEC NVDIMM-P Bus Protocol.

The memory sub-system 110 can buffer read commands and write commands received from the command bus 121 in the local memory 119 or another memory. The media controller 115 can execute the buffered commands in an order different from the order in which the commands are received.

The memory sub-system 110 has a certain amount of capacity for buffering pending read commands and write commands and their associated data. The memory controller 116 and the media controller 115 can communicate with each other to prevent buffer overflow in the memory sub-system 110.

For example, a write credit can be used to represent a unit of buffer capacity that is available for buffering a write command and its associated data of a predetermined size. In some instances, a write command can have data larger than the predetermined size; and such a write command requires multiple write credits for buffering the command and its data in the memory sub-system 110.

The memory controller 116 can maintain a count of write credits it can use to transmit write commands on the command bus 121 to the memory sub-system 110. When a write command is sent over the command bus 121, the memory controller 116 deducts the write credits used by the write command. To avoid buffer overflow, the memory controller 116 should not transmit a write command when the memory controller 11 does not have sufficient write credits for transmitting the write command to the memory sub-system 110.

The media controller 115 can maintain a count of write credits it can return to the memory controller 116 for completed write commands. After a write command buffered in the memory sub-system 110 is completed, the buffer space used by the write command can be freed to accept further write commands from the memory controller 116. The write credits used by the write command that has been completed can be added to the count of write credits that can be returned to the memory controller 116.

The memory sub-system 110 can use the metadata bus 127 to specify the number of write credits it is returning to the memory controller 116. For example, after sending a response signal on the transaction bus 125 to enable the memory controller 116 to issue a send command, the media controller 115 can transmit the number of returned write credits using the metadata bus 127. The memory sub-system 110 can transmit such a response signal in response to a read command, such as XREAD and SREAD identified in the JEDEC NVDIMM-P Bus Protocol. An example of the response signal is RSPx_n identified in the JEDEC NVDIMM-P Bus Protocol.

When the memory controller 116 uses a read command to request retrieval of data from an address, the memory controller 116 can place an address command immediately following the read command to specify the address. Similarly, when the memory controller 116 uses a write command to store data at an address, the memory controller 116 can place an address command immediately following the write command to specify the address. An example of such an address command is XADR identified in the JEDEC NVDIMM-P Bus Protocol.

The write credit manager 112 of the host system 120 has a counter of write credits at the host system 120 representing the amount of buffer space known to be available in the memory sub-system 110 to buffer write commands transmitted from the host system 120.

When the host system 120 transmits a write command to the memory sub-system, the write credit manager 112 of the host system 120 reduces its counter of write credits at the host system 120 by an amount corresponding to a buffer capacity occupied by the write command and its data. When the host system 120 does not have sufficient write credits to transmit a write command, the host system 120 does not transmit the command to avoid buffer overflow at the memory sub-system 110.

The memory sub-system 110 includes a write credit manager 113 that is operable to monitor the write buffer(s) that can be located in the local memory 119 or another memory in the memory sub-system 110. A total count of write credits at the memory sub-system 110 identifies the total buffer capacity available for allocation to the host system 120 for transmitting write commands from the host system 120 to the memory sub-system 110. When a write command is buffered, the amount of buffer space occupied by the write command in the buffer identifies the amount of write credits used by the write command. The amount of write credits can be determined based on the size of the data associated with the write command. The total count of write credits at the memory sub-system 110 can be reduced by the write credits transmitted from the memory sub-system 110 to the host system 120. The transferred write credits represent the amount buffer capacity that is allocated for use by the host system 120 to send new write commands. After a write command is executed and/or cleared from the buffer, the total count of write credits can be increased by the amount of write credits used by the write command.

The host system 120 can receive write credits from the memory sub-system 110; and the write credits in the host system 120 indicate an amount of buffer capacity that is allocated for the host system 120 to transmit write commands. Typically, write credits are transmitted from the memory sub-system 110 to the host system 120 as a response to an information request from the host system 120.

In one or more embodiments, the host system 120 can receive write credits from the memory sub-system 110 without the need for the host system 120 to first send an information request to the memory sub-system 110. An example of the information request is a read command, such as SREAD and/or XREAD (or status_read) identified in the JEDEC NVDIMM-P Bus Protocol.

Figure 3:
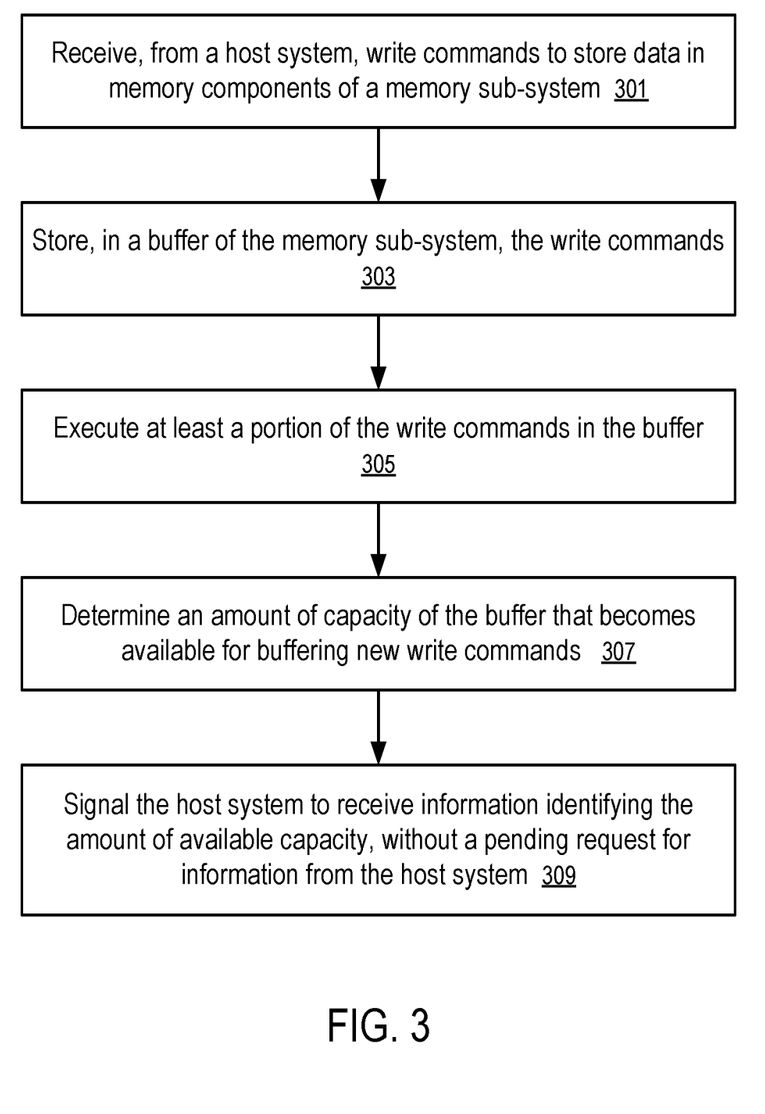
FIG. 3 is a flow diagram of an example method to communicate information about available buffer capacity for accepting write commands in accordance with some embodiments of the present disclosure.

FIG. 3 is a flow diagram of an example method to communicate information about available buffer capacity for accepting write commands in accordance with some embodiments of the present disclosure. The method of FIG. 3 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 3 is performed by the write credit manager 113 of FIG. 1 or 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 301, the media controller 115 receives, from the host system 120, write commands to store data in memory components 109A to 109N of the memory sub-system 110.

At block 303, the media controller 115 stores the write commands in a buffer of the memory sub-system 110. For example, the buffer can be implemented in the local memory 119 or another memory.

At block 305, the media controller 115 executes at least a portion of the write commands in the buffer. Upon completion of the execution of the write commands, the write commands and their data can be cleared from the buffer; and thus, the media controller 115 can make the buffer capacity previously used by the write commands available for receiving write commands.

At block 307, the write credit manager 113 determines an amount of capacity of the buffer that becomes available for buffering new write commands. The amount can be in the form of write credits, where each write credit represents a predetermined amount of buffer capacity usable for buffering a write command and/or its data.

At block 309, the write credit manager 113 causes the memory sub-system 110 to signal the host system 120 to receive information identifying the amount of available capacity, without a pending request for information from the host system. An example of such a pending request is a read command, such as SREAD or XREAD (or status_read) identified in the JEDEC NVDIMM-P Bus Protocol.

Figure 4:
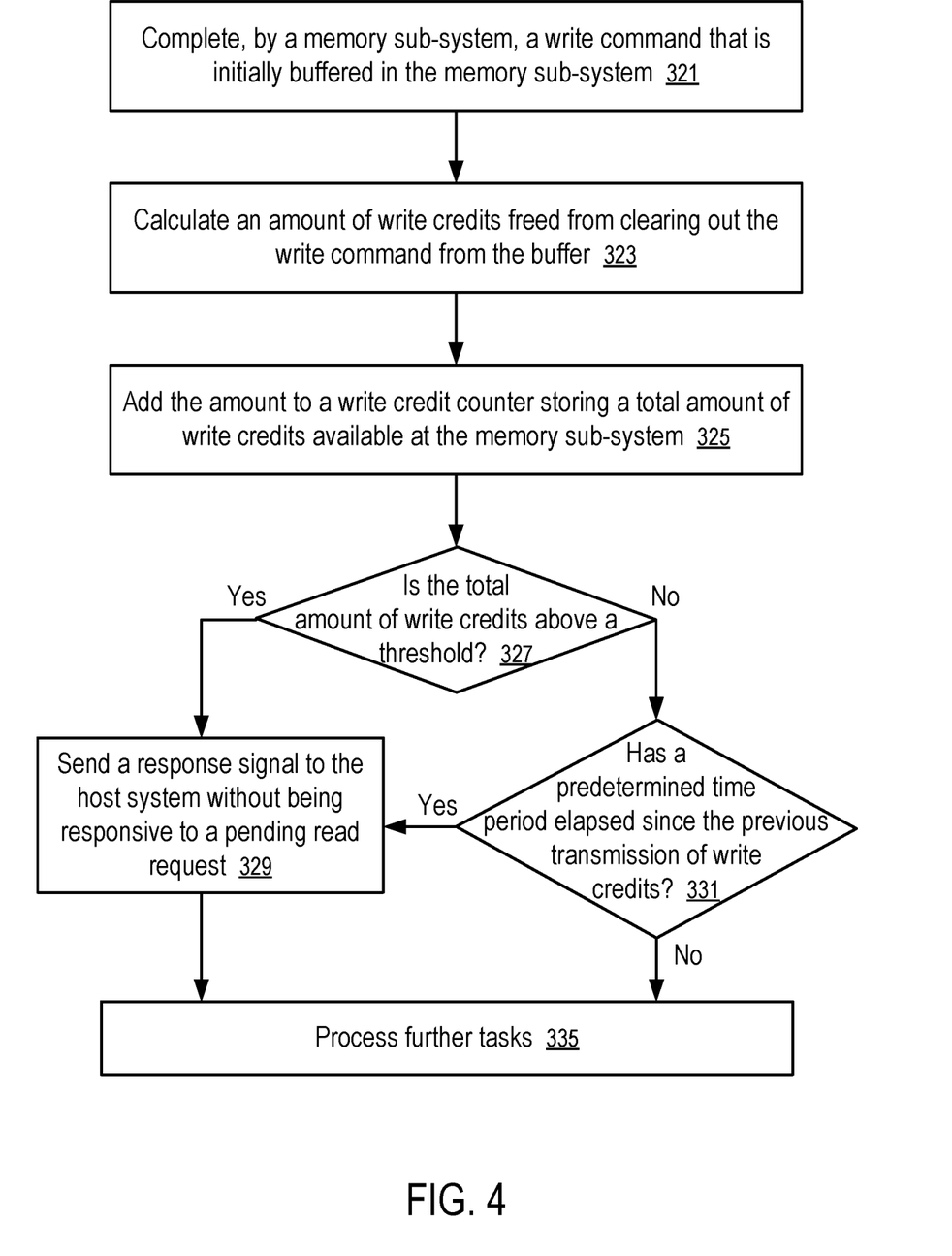
FIG. 4 is a flow diagram of a detailed example method to communicate write credits in accordance with some embodiments of the present disclosure.

FIG. 4 is a flow diagram of a detailed example method to communicate write credits in accordance with some embodiments of the present disclosure. The method of FIG. 4 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 4 is performed by the write credit manager 113 of FIG. 1 or 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 321, the memory sub-system 110 completes a write command that is initially buffered in the memory sub-system 110.

At block 323, the write credit manager 113 calculates an amount of write credits freed from clearing out the write command from the buffer after its execution.

At block 325, the write credit manager 113 adds the amount to a write credit counter storing a total amount of write credits available at the memory sub-system 110 that can be used to accept and buffer write commands from the host system 120.

At block 327, the write credit manager 113 determines whether the total amount of write credits is above a threshold.

At block 329, if the total amount of write credits is above the threshold, the write credit manager 113 causes the memory sub-system 110 to send 329 a response signal to the host system without being responsive to a pending read request.

An example of the response signal is RSPx_n identified in the JEDEC NVDIMM-P Bus Protocol, which can cause the host system to retrieve from the memory sub-system 110 information about write credits the memory sub-system 110 can return to the host system 120.

An example of a pending read request is status_read identified in the JEDEC NVDIMM-P Bus Protocol. In some instances, the response signal can be transmitted by the memory sub-system 110 without any pending read commands, such as SREAD or XREAD (or status_read) identified in the JEDEC NVDIMM-P Bus Protocol.

Typically, a response signal is transmitted in response to a read command, from the host system 120, that requests information from the memory sub-system 110, indicating that the requested information is ready for being transmitted. However, when the total amount of write credits is above the threshold, the response signal can be sent to 329 without being responsive to a pending read request. Such a situation can occur when the memory sub-system 110 does not have a pending read request at a time when the total amount of write credits is above the threshold. In another example, such a situation can occur when the memory sub-system 110 has received a read command (e.g., SREAD or XREAD in the JEDEC NVDIMM-P Bus Protocol) at a time when the total amount of write credits is above the threshold, but the result as of the read command is not yet ready for transmission to the host system 120. Thus, the response signal is not response to the read command.

However, if at the time of the transmission of the response signal, information as requested by a pending read request is ready for transmission, the memory sub-system 110 can send 329 the response signal as being responsive to the read request.

At block 331, if the total amount of write credits is not above the threshold, the write credit manager 113 determines whether a predetermined time period has elapsed since the previous transmission of write credits; and if so, at block 329, the write credit manager 113 causes the memory sub-system 110 to send 329 a response signal to the host system even without a pending read request.

At block 335, the controller 115 of the memory sub-system 110 optionally processes further tasks, before repeating some of the tasks discussed above, such as completing another write command buffered in the memory sub-system 110 to free up more write credits.

In response to the response signal sent 329 from the memory sub-system 110, the controller 116 of the host system 120 can perform operations to retrieve information identifying write credits returned from the memory sub-system 110.

For example, the write credit manager 112 of the host system 120 can retrieve a write credit increment transmitted on the metadata bus 127 and add the increment to the total write credits at the host system 120.

For example, the controller 116 of the host system 120 can transmit a send command on the command bus 121 to instruct the controller 115 of the memory sub-system 110 to transmit information and/or data to the host system 120, including the write credit increment.

In some implementations, the write credit increment can be transmitted from the memory sub-system 110 to the host system 120 using the metadata bus 127 without requiring the host system 120 to issue a send command on the command bus 121.

In some implementations, the threshold used in block 327 can be specified by a communication from the host system 120.

Figure 5:
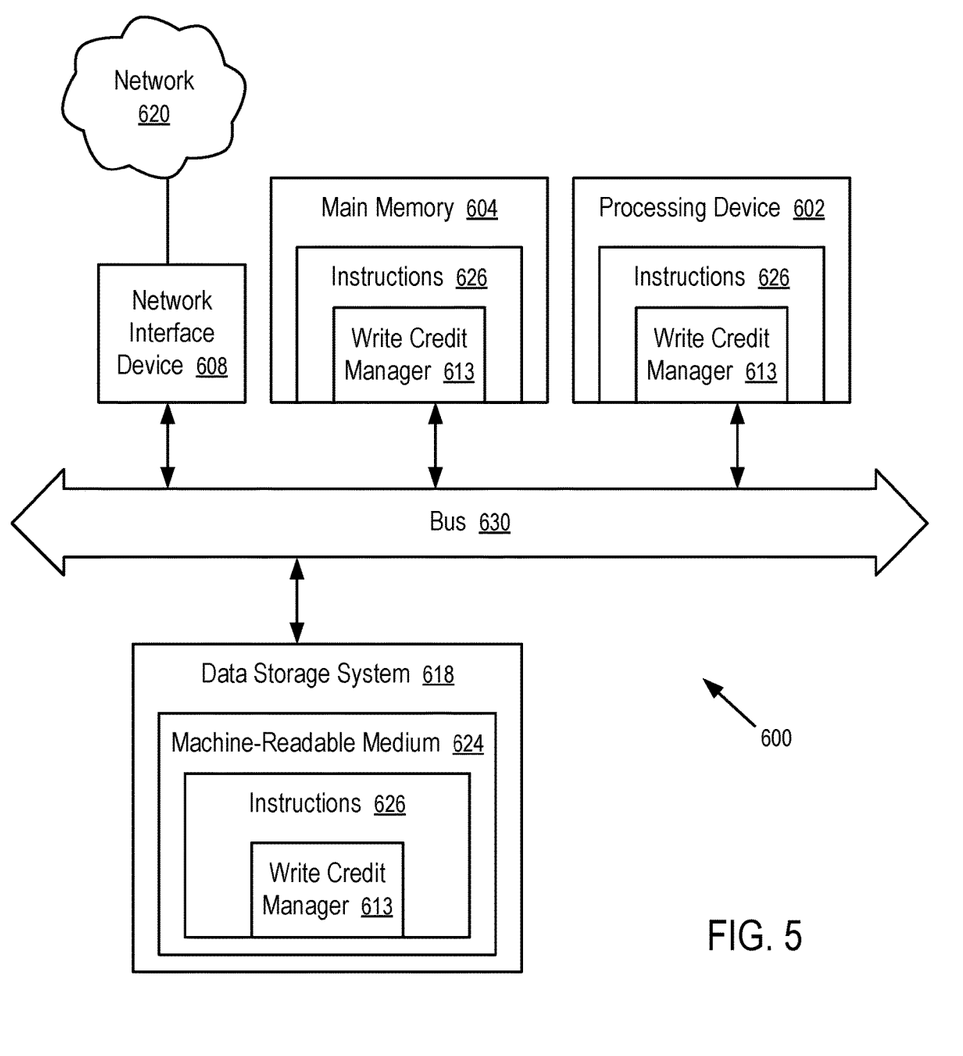
FIG. 5 is a block diagram of an example computer system in which embodiments of the present disclosure can operate.

FIG. 5 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a write credit manager 613 (e.g., to execute an operating system to perform operations corresponding to the write credit manager 113 and/or the write credit manager 112 described with reference to FIGS. 1, 2, 3, and 4). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 618, which communicate with each other via a bus 630 (which can include multiple buses).

Processing device 602 represents one or more general-purpose processing devices such as a microprocessor, a central processing unit (CPU), or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), a graphics processing unit (GPU), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a write credit manager 613 (e.g., a write credit manager 113 or a write credit manager 112 described with reference to FIGS. 1, 2, 3, and 4). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
receiving, in a memory module connected to a host system via a memory bus, write commands to store data in one or more memory components of the memory module;
queuing, in a buffer of the memory module, the write commands;
executing, by a controller of the memory module, at least a portion of the write commands from the buffer;
determining an amount of available capacity of the buffer that is freed as a result of the executing of at least the portion of the write commands; and
sending a signal over the memory bus to the host system to request the host system to receive information identifying the amount of available capacity, without a pending information request received in the memory model from the host system;
wherein the one or more memory components include non-volatile memory; the memory bus includes:
a command bus to transmit the write commands;
a data bus to transmit the data requested to be stored by the write commands; and
a transaction bus to signal the host system to receive the information identifying the amount of available capacity.

2. The method of claim 1, further comprising:
determining whether or not to signal the host system to receive the information identifying the amount of available capacity without a pending request for information from the host system.

3. The method of claim 2, wherein the determining is based on whether the amount of available capacity is above a threshold.

4. The method of claim 3, further comprising:
receiving the threshold from the host system.

5. The method of claim 3, further comprising:
determining whether a predetermined time period has passed since a previous transmission of information related to available capacity for buffering write commands, if the amount is below the threshold.

6. The method of claim 5, wherein the signal is sent in response to a determination that the predetermined time period has passed.

7. The method of claim 1 wherein the write commands are in accordance with a communication protocol for non-volatile dual in-line memory modules.

8. A memory system, comprising:
a plurality of memory components; and
a processing device, operatively coupled with the plurality of memory components, to:
receive, from a host system, write commands to store data in the memory components;
store the write commands in a buffer;
execute at least a portion of the write commands;
determine an amount of available capacity of the buffer that becomes available after execution of at least the portion of the write commands; and
signal the host system to receive information identifying the amount of available capacity, without a pending information request received from the host system;
wherein the memory components include non-volatile memory; the memory system is coupled to the host system via:
a command bus to transmit the write commands;
a data bus to transmit the data requested to be stored by the write commands; and
a transaction bus to signal the host system to receive the information identifying the amount of available capacity.

9. The memory system of claim 8 wherein the processing device is further configured to:
determine whether or not to signal the host system to receive the information identifying the amount of available capacity without a pending request for information from the host system.

10. The memory system of claim 9, wherein a determination of whether or not to signal the host system to receive the information identifying the amount of available capacity without a pending request for information from the host system is based on whether the amount of available capacity is above a threshold.

11. The memory system of claim 10, wherein the processing device is further configured to:
receive the threshold from the host system.

12. The memory system of claim 10, wherein the processing device is further configured to:
determine whether a predetermined time period has passed since a previous transmission of information related to available capacity for buffering write commands, if the amount is below the threshold.

13. The memory system of claim 12, wherein the host system is signaled to receive the information identifying the amount of available capacity in response to a determination that the predetermined time period has passed.

14. The memory system of claim 8 wherein the write commands are in accordance with a communication protocol for non-volatile dual in-line memory modules.

15. A non-transitory computer-readable storage medium storing instructions that, when executed by a processing device, cause the processing device to:
receive, in a memory module connected to a host system via a memory bus, write commands to store data in one or more memory components of the memory module;
store, in a buffer of the memory module, the write commands;
execute, by the processing device of the memory module, at least a portion of the write commands from the buffer;
determine an amount of available capacity of the buffer that is freed as a result of the executing of at least the portion of the write commands; and
transmit a signal over the memory bus to the host system to request the host system to receive information identifying the amount of available capacity, without a pending information request received in the memory model from the host system;
wherein the one or more memory components include non-volatile memory; the memory bus includes:
a command bus to transmit the write commands in accordance with a communication protocol for non-volatile dual in-line memory modules;
a data bus to transmit the data requested to be stored by the write commands; and
a transaction bus to signal the host system to receive the information identifying the amount of available capacity.

16. The non-transitory computer-readable storage medium of claim 15, wherein the instructions further cause the processing device to:
determining whether a predetermined time period has passed since a previous transmission of information related to available capacity for buffering write commands, if the amount is below the threshold, wherein the signal is sent in response to a determination that the predetermined time period has passed.

17. The non-transitory computer-readable storage medium of claim 16, wherein the instructions further cause the processing device to:

determine that the signal has timed out without the host system receiving the information identifying the amount of available capacity and in response, re-transmit the signal after a delay period.

* * * * *